(12) United States Patent
Gilissen et al.

(10) Patent No.: US 7,064,808 B1
(45) Date of Patent: Jun. 20, 2006

(54) SUBSTRATE CARRIER AND METHOD FOR MAKING A SUBSTRATE CARRIER

(75) Inventors: Noud Jan Gilissen, Eindhoven (NL); Joost Jeroen Ottens, Veldhoven (NL); Harmen Klaas Van Der Schoot, Vught (NL); Petrus Matthijs Henricus Vosters, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 41 days.

(21) Appl. No.: 10/829,462

(22) Filed: Apr. 22, 2004

(30) Foreign Application Priority Data

Apr. 22, 2003 (EP) .................................. 03076171
Jun. 30, 2003 (EP) .................................. 03077038

(51) Int. Cl.
G03B 27/58 (2006.01)
G03B 27/62 (2006.01)

(52) U.S. Cl. ........................................ 355/72; 355/75
(58) Field of Classification Search ............ 355/72–77, 355/30, 53; 430/58.1, 66, 60; 118/715, 118/730, 725
See application file for complete search history.

(56) References Cited

U.S. PATENT DOCUMENTS

| 5,229,872 | A | 7/1993 | Mumola | ...................... 359/40 |
| 5,296,891 | A | 3/1994 | Vogt et al. | ..................... 355/67 |
| 5,523,193 | A | 6/1996 | Nelson | ....................... 430/311 |
| 5,847,813 | A * | 12/1998 | Hirayanagi | ................... 355/75 |
| 5,969,441 | A | 10/1999 | Loopstra et al. | .............. 310/12 |
| 6,046,792 | A | 4/2000 | Van Der Werf et al. | ...... 355/53 |
| 6,188,150 | B1 | 2/2001 | Spence | |
| 6,320,649 | B1 * | 11/2001 | Miyajima et al. | ............. 355/72 |
| 6,353,271 | B1 | 3/2002 | Williams | |
| 6,480,260 | B1 * | 11/2002 | Donders et al. | .............. 355/53 |
| 2002/0145714 | A1 * | 10/2002 | Hirayanagi | ................... 355/53 |
| 2002/0159046 | A1 * | 10/2002 | Binnard et al. | ............... 355/74 |
| 2005/0151945 | A1 * | 7/2005 | Van Der Schoot et al. | ... 355/53 |
| 2005/0269525 | A1 * | 12/2005 | Terken et al. | ............ 250/492.2 |

FOREIGN PATENT DOCUMENTS

| DE | 198 05 875 C1 | 4/1999 |
| WO | WO98/33096 | 7/1998 |
| WO | WO98/38597 | 9/1998 |
| WO | WO98/40791 | 9/1998 |

* cited by examiner

Primary Examiner—W. B. Perkey
Assistant Examiner—Vivian Nelson
(74) Attorney, Agent, or Firm—Pillsbury Winthrop Shaw Pittman LLP

(57) ABSTRACT

A carrier for carrying a lithographic substrate or a lithographic patterning means. The carrier comprises a first member provided with an open hollow structure that is open to at least one side of the member. The carrier further comprises a second member connected to the first member, such that a closed hollow internal structure is formed between the carrier members.

24 Claims, 3 Drawing Sheets

SUBSTRATE CARRIER AND METHOD FOR MAKING A SUBSTRATE CARRIER

This application claims priority from EP application no. 03076171.2 filed Apr. 22, 2003 and EP application no. 03077038.2 filed Jun. 30, 2003, the contents of both applications are incorporated herein in their entireties.

FIELD OF THE INVENTION

The present invention relates to a carrier constructed to carry a lithographic substrate or a lithographic patterning device.

The present invention further relates to a method for making a lithographic carrier, and still further relates to a lithographic apparatus including a lithographic carrier.

RELATED ART

The term "patterning device" or "patterning structure" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device or patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The necessary matrix addressing can be performed using suitable electronic devices. In both of the situations described hereinabove, the patterning device or patterning structure can comprise one or more programmable mirror arrays. More information on mirror arrays as here referred to can be gleaned, for example, from United States patents U.S. Pat. No. 5,296,891 and U.S. Pat. No. 5,523,193, and PCT patent applications WO 98/38597 and WO 98/33096, each of which is incorporated herein by reference thereto. In the case of a programmable mirror array, the support structure may be embodied as a frame or table, for example, which may be fixed or movable as needed; and A programmable LCD array. An example of such a construction is given in United States patent U.S. Pat. No. 5,229,872, which is incorporated herein by reference thereto. As above, the support structure in this case may be embodied as a frame or table, for example, which may be fixed or movable as needed.

For purposes of simplicity, the rest of this text may, at certain locations, specifically direct itself to examples involving a mask and mask table; however, the general principles discussed in such instances should be seen in the broader context of the patterning device or patterning structure as hereinabove set forth.

Lithographic apparatus can be used, for example, in the manufacture of integrated circuits (ICs). In such a case, the patterning device or patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, which is incorporated herein by reference thereto.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are needed, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, which is incorporated herein by reference thereto.

For the sake of simplicity, the projection system may hereinafter be referred to as the "lens"; however, this term should be broadly interpreted as encompassing various types of projection system, including refractive optics, reflective optics, and catadioptric systems or even systems applying the so-called nano-imprint technology, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, which are incorporated herein by reference thereto.

In the lithographic apparatus the substrate and the patterning device or patterning structure have to be positioned fast and accurately with respect to the projection system. In particular in case of the substrate table and the supporting structure, referred to as the substrate carrier, the carrier being preferably made of a material which is stiff (i.e. has a high specific stiffness [E/ρ]) to reduce the risks of vibrations and deformations, and is lightweight [ρ] so that it can be easily accelerated.

It is known to manufacture carriers from a solid block of a material preferably having a (very) low, i.e. a near-zero coefficient of linear thermal expansion and which is therefore thermally stable. In order to reduce the moving mass of the carrier so that it can be positioned more accurately, despite of possible fluctuations in the temperature, known carriers are for the above reasons often made of glass or another ceramic material, machined, e.g. by milling, to form open spaces inside the solid block, in order to reduce its weight.

The known carrier may have a box-like structure with a first side provided with a space for receiving the substrate or the patterning device or the patterning structure. By machining the carrier to reduce its weight, a maximum reduction of weight of about 65% can be achieved.

Even bigger reductions in weight are preferred to further improve the possible handling speed and positional accuracy of the carrier.

However if even more material is removed from the known carrier, this will reduce the stiffness thereof in an unacceptable manner and as a result of that, the dynamic properties of the carrier will become less optimal. Furthermore the carrier will become more sensitive to unwanted disturbances, such as vibrations, that reduce the accuracy by which the carrier can be positioned. A problem associated with the conventional milling cut procedure is that it is difficult to make thin walled structures, consequently of low weight, because the accuracy of the milling cut machine is largely dependent on the depth it reaches in the base material of the carrier. Also stability due to the side forces of the milling technique plays a role. Thin walls will not be stable enough to withstand the side forces exerted thereon by the milling tools.

SUMMARY OF THE INVENTION

Embodiments of the present invention include a carrier which has an even further reduced weight without compromising the stiffness and dynamical properties thereof.

Embodiments according to the present invention comprise a carrier as specified in the opening paragraph, which further comprises a second member connected to the first member, such that a closed hollow internal structure is formed between the members.

The inventors have realized that a substantially closed hollow box provides a carrier that can be lighter than known carriers having at least one open third side to allow for the removal of material. A carrier that is substantially closed, i.e. that has no open side, will have a larger specific stiffness compared to a carrier having an open side. Consequently, the walls of such a carrier can be made thinner as compared to a conventional carries, to obtain a certain required degree of specific stiffness compared to the conventional carriers. The carrier may contain openings, for instance, for guiding utilities such as wiring to the inside of the carrier. The inside of the carrier may contain positioning devices or measuring devices, that need cabling. Therefore, it will be understood that the term substantially closed, also encompasses carriers having such openings.

According to an embodiment of the present invention, the second member has an open, hollow structure which together with the open hollow structure of the first member forms the closed internal structure of the carrier. Providing both members with an open, hollow structure, simplifies forming a closed internal structure.

According to an embodiment of the present invention, in the open, hollow structure a plurality of spaced apart ribs are provided. These ribs make the carrier more rigid, adding minimal weight.

According to an embodiment of the present invention, a third member is provided, positioned between the first and second member, which third member has an open, hollow structure, that is open to two opposite sides thereof. Positioning a third member between the first and second members is an easy way to increase the height of the carrier, while the thickness of the first and second member may remain relatively small, enabling accurate manufacturing processes and thus creating relatively thin walls.

According to an embodiment of the present invention, the third member comprises a plurality of spaced apart ribs in the open, hollow structure. This provides extra specific stiffness to the third member.

According to an embodiment of the present invention, an additional plate is positioned against the ribs. This is a convenient way to make the carrier more rigid, and providing a single level interface for machinery placed inside the carrier.

According to an embodiment of the present invention, different members of the carrier can be made of different materials, of which at least one material is chosen from a group comprising glass, carbon and/or ceramics. The substrate or patterning device holder can be made out of the same base material (monolithic) as the carrier so that the physical properties are the same. However, it can also be advantageous to make different parts of the holder from different materials in order to obtain different characteristics on different places in the holder.

According to a further aspect, the invention relates to a lithographic apparatus comprising a radiation system constructed to provide a projection beam of radiation; a support structure constructed to support a patterning device or patterning structure, the patterning device or patterning structure serving to impart a cross-section of the projection beam with a pattern to form the patterned beam; and a projection system that projects the patterned beam onto a target portion of the substrate, wherein the apparatus comprises a table constructed to hold the substrate respectively the patterning device or patterning structure, comprising a carrier according to the invention. A carrier according to the invention can advantageously be used in a lithographic apparatus, since fast and accurate positioning of the carrier is needed in such apparatus.

According to an other aspect, the present invention relates to a method for making a carrier, for carrying a lithographic substrate respectively a lithographic patterning device or patterning structure, comprising connecting at least two members to each other to form a carrier, where the members are formed in such a way that the carrier comprises a substantially closed, hollow internal structure. Forming a carrier with a substantial closed, hollow internal structure, provides a carrier, that is relatively rigid and light-weighted.

According to an embodiment of the present invention, the method comprises forming the at least two members by means of a milling technique.

Since the members of which the carrier is formed are less thick than the corresponding members of a conventional carrier, the milling process can be applied with an increased accuracy, resulting in thinner walls. Thinner wall structures have also become possible, because of the fact that water jet cutting techniques, that do not exert side forces, can be used for certain members.

The depth in which material can be taken from the carrier determines the accuracy of the machining, in particular the milling cut procedure. If the carrier is made out of one part the total height of the carrier will determine the depth over which the material has to be removed with the milling cut procedure. By making the carrier out of two pieces the depth in which both parts have to be subjected to the milling cut procedure is reduced and the accuracy with which both parts can be manufactured is increased and the thickness of the walls can be reduced, making the carrier even lighter.

According to an embodiment of the present invention, the method further comprises providing at least one of the members with a device for holding a substrate or a patterning device or patterning structure, such as for example an electro-static clamp. Substrates and patterning devices or patterning structures, such as used in the lithographic industry, need to be positioned fast and accurately, so carriers according to the invention can advantageously be used in this field of technology. Such a device can hold a substrate or a patterning device or patterning structure in a fixed and well-defined position.

According to an embodiment of the present invention, the method comprises forming the carrier, that is provided with a mirror on at least one side of the carrier, arranged to be used in combination with a position determining unit, e.g. an interferometric measuring device. Such a mirror can be used in cooperation with the interferometric measuring device, allowing fast and accurate positional measurement.

According to an embodiment of the present invention, the method comprises forming a hollow structure in a third member in such a way that the third member comprises a first and a second open side, attaching the first member (15) to the first open side of the third member (16) and attaching the second member (17) to the second open side of the third member (16) in such a way that the carrier (10) comprises a substantially closed, hollow internal structure. This allows producing a carrier being relatively thick.

According to an embodiment of the present invention, the method comprises forming a hollow structure in the first and second member in such a way that the first and second member have one open side, attaching the open side of the first member to the first open side of the third member and attaching the open side of the second member to the second open side of the third member in such a way that the carrier comprises a substantially closed, hollow internal structure. By dividing the carrier in more than two members, the members that are not the top or bottom member can be formed using techniques other than milling techniques, such as water jet cutting techniques, that are more accurate and work independent of the height of the member. Water jet cutting machines work a water jet that does not exert side forces on the material the jet is acting upon, and can make holes with two open sides. The accuracy of the machine is very high and therefore the walls can be made very small independent of the height of the third member. Further on, milling techniques can be applied to the top and bottom member even more accurate, since the thickness of those members can be made relatively small.

According to an embodiment of the present invention, the method comprises providing an additional plate in between the first and third member and/or the second and third member. This provides a relatively light weight strengthening of the carrier.

According to an embodiment of the present invention, the method comprises forming a hollow structure in the third member using an extrusion technique or a water jet cutting technique. These techniques are known to be very accurate and can therefore create thin walls inside the second member, forming the hollow structure. These techniques are also advantageous since no forces that are directed sideways occur.

According to an embodiment of the present invention, the method comprises forming openings in the carrier. Such openings can be used to adapt the inner structure of the carrier to fluctuations in the pressure, i.e. pressure variations inside the carrier can be equalised over the inner structure of the carrier. The openings can also be used to supply control or power cables to machinery inside the carrier.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE DRAWINGS

Figure 1:
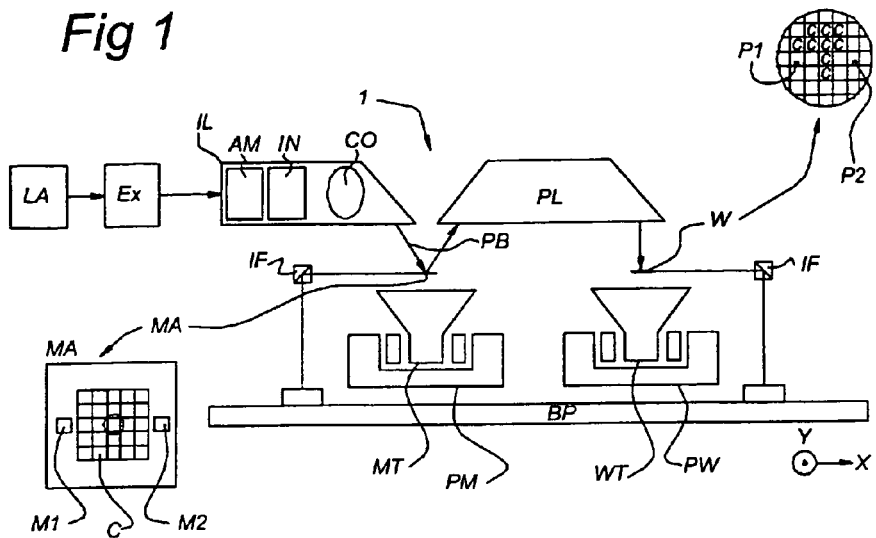
FIG. 1 schematically depicts a lithographic apparatus according to an embodiment of the invention.

FIG. 1 schematically depicts a lithographic apparatus 1 according to a particular embodiment of the invention. The apparatus comprises a radiation system Ex, IL, constructed to supply a projection beam PB of radiation (e.g. ultra violet radiation). In this particular case, the radiation system also comprises a radiation source LA;

a first object table (mask table) MT provided with a mask holder for holding a patterning device, illustrated in the form of the mask MA (e.g. a reticle), and connected to a first positioning device PM for accurately positioning the mask with respect to item PL;

a second object table (substrate table) WT provided with a substrate holder for holding a substrate W (e.g. a resist-coated silicon wafer), and connected to a second positioning device PW for accurately positioning the substrate with respect to item PL; and a projection system ("lens") PL (e.g. lenses, mirrors) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning devices, such as a programmable mirror array of a type as referred to above.

The source LA produces a beam of radiation. This beam is fed into an illumination system (illuminator) IL, either directly or after having traversed a conditioning device, such as a beam expander Ex, for example. The illuminator IL may comprise adjusting devices AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic apparatus (as is often the case when the source LA is a mercury lamp, for example), but that it may also be remote from the lithographic apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In the remainder of the following description of the present invention, the invention will be described by means of a carrier for carrying a substrate (substrate carrier). It is however not intended to limit the present in any way to such a substrate carrier only, but to describe the present invention by example only.

Figure 2:
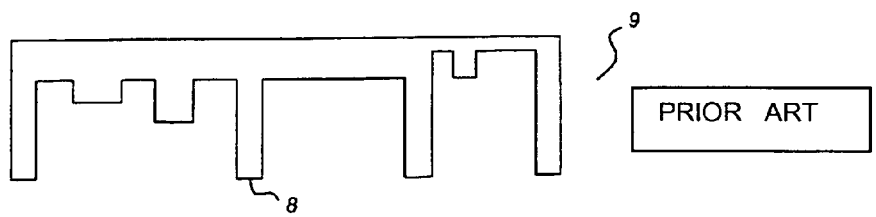
FIG. 2 schematically depicts a carrier according to the prior art.

In a substrate carrier 9 according to the prior art and as depicted in FIG. 2, at least one side of the substrate carrier 9 is open and used to create a hollow structure in the substrate carrier 9, for instance, with a milling process. The hollow structure is formed in order to reduce the weight of the substrate carrier 9. In the interior of the substrate carrier 9 ribs 8 of different heights are formed to provide a multi-level interface for machinery, such as motors and sensors, that needs to be placed in the substrate carrier 9. The substrate carrier 9 has at least one open side. On top of the substrate carrier 9 a substrate, such as patterning devices or a wafer can be positioned. Therefore, the substrate carrier is preferably provided with devices to fixably position the substrate on its position.

Figure 3:
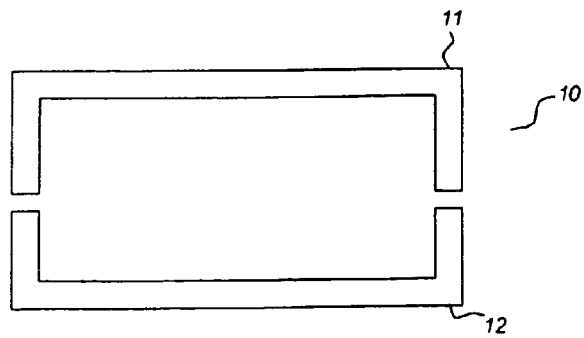
FIG. 3 schematically depicts a carrier according to a first embodiment of the present invention.

In a substrate carrier 10 according to a first embodiment of the invention, as depicted by a schematic side view in FIG. 3, the substrate carrier 10 is divided in a top and a bottom member 11, 12. Although the top and bottom members 11, 12 are shown here as being separated, the members are connected to each other to form a substrate carrier 10. Different techniques for connecting will be described below.

The members 11, 12 are made hollow by using, for instance, a milling process, but since the thickness of the top and bottom member 11 and 12 is smaller than that of the assembled substrate carrier 10, the milling process can be performed more accurately. As a result of this, the walls that remain after the milling process can be thinner. This provides a substrate carrier 10 that is relatively light weight as compared to known/conventional substrate carriers.

By dividing the substrate carrier 10 in a top and a bottom member 11, 12 halfway its height, the depth is reduced by a factor 2, as compared to the substrate carrier 9 with an open box structure as shown in FIG. 2. The technique is preferably used for a substrate carrier 10 having a reduced height, of, for instance, less than 80 mm. The two separate members 11, 12 subsequently have an height of less than 40 mm and the walls of the top 11 and bottom member 12 can have a thickness of approximately 2–3 mm. The preferred thickness of the walls depends on the specific requirements. In general, the walls are preferably kept as thin as possible, however, the substrate carrier 10 should also be rigid and strong enough to allow accurate handling and positioning of the substrate.

Since the substrate carrier 10 has a partially closed or closed box structure, i.e. it does not have an open side, the structure is much more rigid than conventional substrate carriers 9 having an open side. Therefore, a reduced amount of material (and mass) is needed to obtain a substrate carrier 10 having an optimal dynamic performance.

Figure 4A:
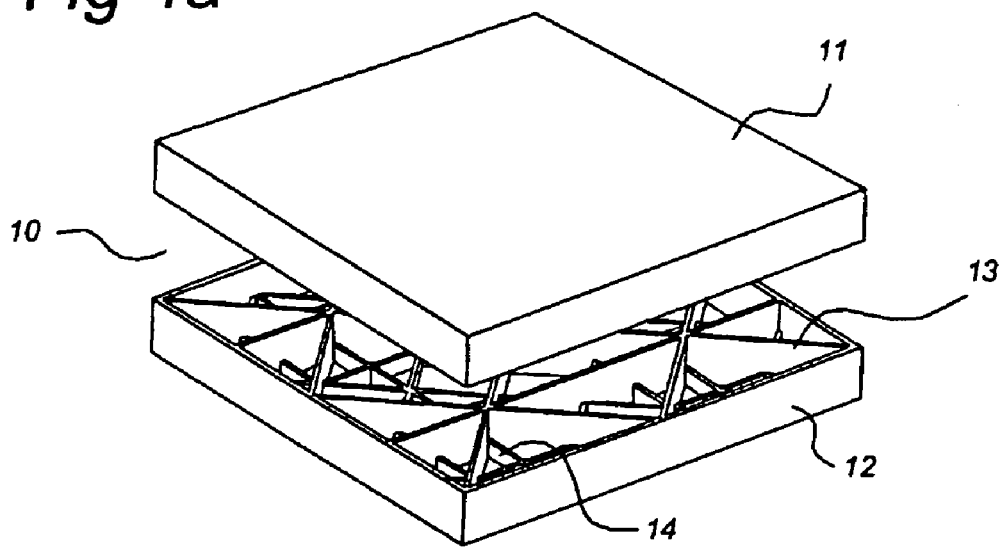
FIGS. 4a and 4b depict a carrier according to a further embodiment of the present invention.
Figure 4B:
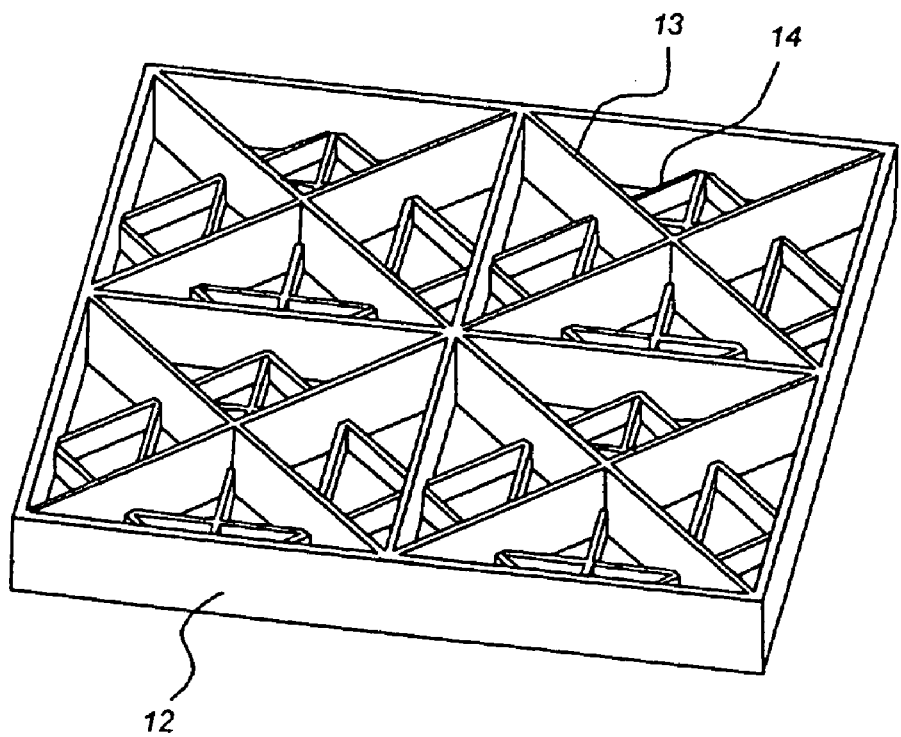

FIG. 4a shows a three dimensional view of a substrate carrier 10 according to a further embodiment, comprising a top member 11 and a bottom member 12. As can be seen, interior ribs 13, 14 are formed on the inside of the substrate carrier 10, the ribs 13, 14 having different heights. Low ribs 14 are formed to optimise the local stiffness of the substrate carrier 10 and to provide an interface relative to which machinery can be positioned. The machinery can be a plurality of motor and sensors. High ribs 13 are formed to strengthen the main structure of the substrate carrier 10. A more detailed view of the ribs 13, 14 is provided by FIG. 4b. Although FIGS. 4a and 4b only show ribs 13, 14 being formed in the bottom member 12, similar ribs 13, 14 are preferably provided in the interior of the top member 11.

Of course, also other rib structures may be provided in the top member 11, and bottom member 12. The rib structure as shown here has good dynamic properties since the ribs 13,14 are formed in a triangular structure. It is also possible to form a rib structure in which all the ribs have a similar height or to provide a rib structure in which ribs have a higher diversity of heights, to further improve the properties of the substrate carrier 10.

Figure 5A:
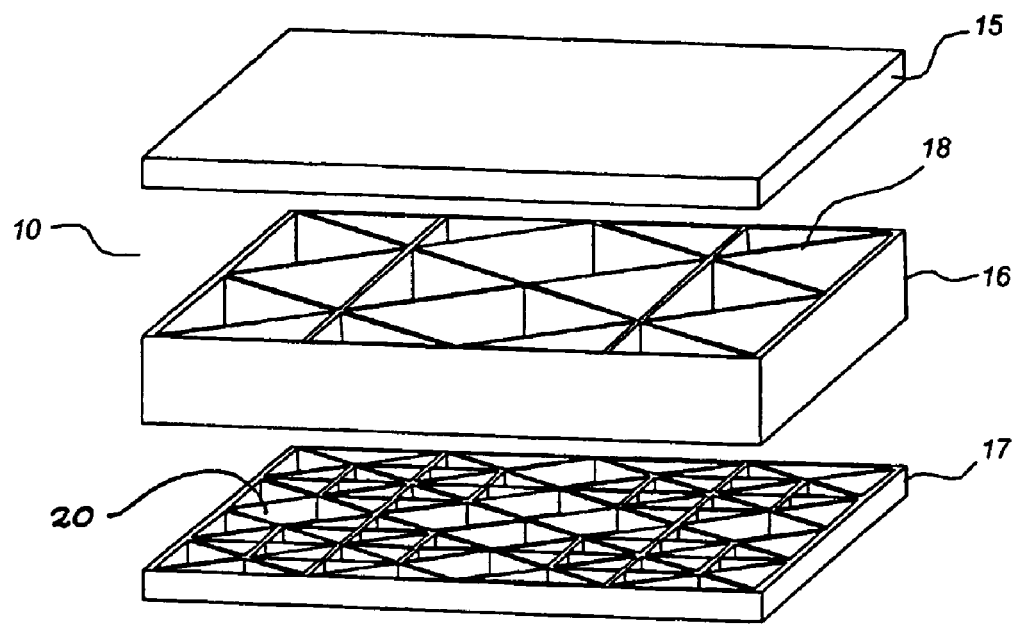
FIGS. 5a and 5b depict alternative embodiments of the present invention.

FIG. 5a shows an alternative embodiment of the substrate carrier 10 according to the present invention. In this embodiment, the substrate carrier 10 is divided in a first member 15, a second member 17 and a third member 16. The first member 15 and second member 17 preferably have a reduced height, so that a rib structure can be formed with an even higher accuracy. The first member 15 and second member 17 preferably have a height of 2 mm, with ribs 20 formed on it, that extend approximately 10 mm from the inner surface of the first member 15 and second member 17 respectively. The ribs 20 can be formed by a milling process and may have a similar triangular structure as discussed above. Of course, the first member 15 and the second member 17 can also be a simple plate and do not need to be a low milled structure with ribs.

Figure 5B:
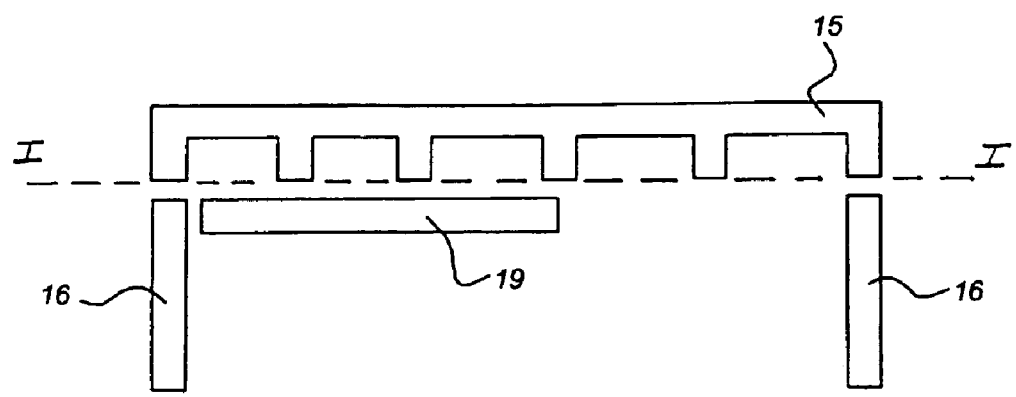

The first member 15 and second member 17 can be further strengthened by placing an additional plate 19 on the rib structure, as is shown in FIG. 5b. Such an additional plate 19 is positioned between the first member 15 and the third member 16, and/or between the second member 17 and the third member 16. Plate 19 also provides an accurate single level interface for machinery that needs to be placed inside the substrate carrier 10.

The substrate carrier 10 can be made out of one, two, three, four or even more members.

In a preferred embodiment, the different members of the substrate carrier 10 are dimensioned in such a way, that all the machinery can be placed against the top member 15 of the substrate carrier 10. Therefore the top member 15 including the ribs 20, has to have a thickness that matches with the preferred position of the machinery.

In an alternative embodiment, the third member 16 could be divided in different sections. This could be done to give the substrate carrier 10 additional stiffness or could be useful if different interface levels need to be provided for the machinery.

The third member 16 is preferably a hollow box with two open sides. The third member 16 can therefore be formed using, for instance, a water jet cutting technique or an extrusion technique. These techniques are very accurate and result in relatively thin interior walls 18 provided in the interior of the third member 16. The interior walls 18 can have a thickness of approximately 1 mm and preferably extend over the full height of the third member 16. In the embodiment shown in FIGS. 5a and 5b, the interior walls 18 are formed in a triangular structure for reasons of strength and stability. Of course, also other structures and thicknesses can be used.

A major difference between the conventional substrate carrier as shown in FIG. 2 and the substrate carrier according to the present invention as shown in FIGS. 5a and 5b, is found in the way the substrate carrier is build up in a layer-wise manner. The substrate carrier 10 of FIGS. 5a and 5b is build up from the lowest level needed in the inner space of the finished carrier. This means that the first and second member 15, 17 have ribs 20 that are of the same minimum required height. This level is indicated in FIG. 5b by means of a dashed line I—I. From this level up (or down depending on which member is considered) the remainder of the carrier structure is build up by means of subsequent members (the third member 16 in FIG. 5a or the plate 19 in FIG. 5b).

By milling the first and second members 15, 17 to form only the shortest ribs, the best results with respect to wall/rib thickness and stability can be obtained. The layer-wise way of assembling the carrier according to the present invention results in an easy and reliable way of providing a carrier having an optimal weight and stability.

The material the substrate carrier 10 is made of, needs to meet strict mechanical and thermal requirements. In order to minimise the weight of the substrate carrier 10, it is preferably made of a material that has a low density. The density of the material is preferably below 3000 kg/m$^3$, for instance 2200 kg/m$^3$. However, the material should also provide a stable substrate carrier 10. Therefore, the elastic modulus E of the material is preferably smaller than $10 \times 10^{11}$ N/m$^2$, for instance, $0.9 \times 10^{11}$ N/m$^2$.

The thermal requirements specifically apply to a low coefficient of linear thermal expansion and a relatively low value for the heat capacity and the thermal conductivity. Preferably a material is chosen that has a coefficient of thermal conductivity of less than $5 \times 10^{-6}$ 1/K, for instance even $50 \times 10^{-9}$ 1/K. The value of the heat capacity is preferably below the 1000 J/(kg K), for instance, 700 J/(kg K).

Finally, the heat conductivity is preferably below the 10 W/(m K), for instance 1,3 W/(m K).

In case the lithographic apparatus uses extreme ultraviolet (EUV) radiation (e.g. having a wavelength in the range 5–20 nm), the substrate carrier 10 having the substrate W thereon will be located in a high or very high vacuum environment. When illuminated by EUV radiation, the reflectivity of multi-layer mirrors in the lithographic apparatus degrades due to chemical processes known as oxidation and carbonization. The contaminating species responsible for these undesirable effects are water vapor and hydrocarbons which are evolved due to the out gassing of all materials in a vacuum environment. Therefore no materials may be used that have unacceptably high vacuum out gassing rates.

Materials such as glass, carbon and/or ceramics, such as, for instance, Zerodur® (produced by Schott), ULE® (Corning), CO210® (Kyocera) have proven to fulfil the above requirements and the substrate carrier is therefore preferably made of these materials. Other examples are HSC701® [Al/SiC] ($M^3$), SiC [direct sintered], SSC-802® [Si/SiC] ($M^3$) or GrAS501® [fibre reinforced AL—Si]($M^3$) and the like. When dealing with (very) high vacuum using ceramic low thermal expansion materials will result in a substrate carrier having the appropriate out gassing properties. Furthermore, it will be easier to reach the required vacuum levels in those parts of the lithographic apparatus where such levels are needed and the design is insensitive to thermal variations.

It will be readily understood by a person skilled in the art that the substrate carrier can be made of one material (monolithic), but the substrate carrier can also be made of different materials (non-monolithic). This can for instance be done when different characteristics are needed for different parts of the substrate carrier.

In the above described embodiments, the substrate carrier is formed by different members. Therefore, the different members need to be attached to each other. This attaching can be achieved in different ways, for instance, by using glue, screws or other clamping techniques. Other suitable attaching techniques include, depending on the materials used: ringing, soldering, fusion bonding, frit bonding, firing (co-firing), low temperature glass bonding (Schott technology) or anodic bonding. These techniques are known in the art.

The carrier is preferably a closed structure in order to provide optimal dynamic characteristics. However, since the interior space of the carrier can be used to install utilities as explained above, the carrier may be provided with openings. These openings in the carrier can be used as venting holes, for instance, for creating a vacuum state inside the hollow structure of the carrier, but the openings can also be used for providing energy or control cables to the installed utilities.

While specific embodiments of the invention have been described above, it will be appreciated that the invention may be practised otherwise than as described. The description is not intended to limit the invention. In particular the present invention is not limited to the example shown in relation to the Figures, i.e. limited to a substrate carrier constructed to carry a lithographic substrate. The present invention also relates to a carrier for constructed to carry a lithographic patterning device. More in general, it shall be understood that the present invention is also applicable to other fields of technology where light-weight and highly stable carrier structures are needed.

The invention claimed is:

1. A carrier constructed to carry a lithographic substrate or a lithographic patterning device, said carrier comprising:
   a first member provided with an open hollow structure that is open to at least one side of said first member, said first member constructed to support a lithographic substrate or a lithographic patterning device; and
   a second member connected to said first member, such that a closed hollow internal structure is formed between said first and second members.

2. A carrier according to claim 1, wherein said second member has an open, hollow structure which together with said open hollow structure of said first member forms said closed internal structure of said carrier.

3. A carrier according to claim 2, wherein said open, hollow structure of said first and second members includes a plurality of spaced apart ribs.

4. A carrier according to claim 1, further comprising:
   a third member positioned between said first and second members, said third member having an open, hollow structure, that is open to two opposite sides thereof.

5. A carrier according to claim 4, wherein said third member includes a plurality of spaced apart interior walls in said open, hollow structure.

6. A carrier according to claim 3, wherein said open, hollow structure of said first and second members includes an additional plate positioned against said ribs.

7. A carrier according to claim 1, wherein said first and second members of said carrier are made of different materials, of which at least one is chosen from a group consisting of glass, carbon and ceramics.

8. A lithographic apparatus comprising:
   a radiation system constructed to provide a beam of radiation;
   a support structure constructed to support a patterning device, said patterning device serving to impart a cross-section of said beam with a pattern to form a patterned beam; and
   a projection system that projects said patterned beam onto a target portion of a substrate, wherein said apparatus further includes a table constructed to hold said substrate or said patterning device, said table including a carrier constructed to carry a lithographic substrate or a lithographic patterning device, said carrier including
   a first member provided with an open hollow structure that is open to at least one side of said first member, said first member constructed to support a lithographic substrate or a lithographic patterning device; and
   a second member connected to said first member, such that a closed hollow internal structure is formed between said first and second members.

9. A lithographic apparatus according to claim 8, wherein said second member has an open, hollow structure which together with said open hollow structure of said first member forms said closed internal structure of said carrier.

10. A lithographic apparatus according to claim 9, wherein said open, hollow structure of said first and second members includes a plurality of spaced apart ribs.

11. A lithographic apparatus according to claim 10, wherein said open, hollow structure of said first and second members includes an additional plate positioned against said ribs.

12. A lithographic apparatus according to claim 8, wherein said carrier further includes a third member positioned between said first and second members, said third member having an open, hollow structure, that is open to two opposite sides thereof.

13. A lithographic apparatus according to claim 12, wherein said third member includes a plurality of spaced apart interior walls in said open, hollow structure.

14. A lithographic apparatus according to claim 8, wherein said first and second members of said carrier are made of different materials, of which at least one is chosen from a group consisting of glass, carbon and ceramics.

15. A method for making a carrier for carrying a lithographic substrate or a lithographic patterning device, the method comprising:
    providing at least two members, one of the at least two members being constructed to support a lithographic substrate or a lithographic patterning device; and
    connecting the at least two members to each other to form a carrier, where the at least two members are formed in such a way that the carrier comprises a substantially closed, hollow internal structure.

16. A method according to claim 15, further comprising:
forming the at least two members by a milling technique.

17. A method according to claim 15, further comprising:
providing at least one of the at least two members with means for holding the substrate or the patterning device.

18. A method according to claim 15, wherein:
forming the carrier includes providing a mirror on at least one side of the carrier, the mirror being arranged to be used in combination with a position determining unit.

19. A method according to claim 15, further comprising:
forming a hollow structure in a third member in such a way that the third member comprises a first and a second open side,
attaching the first member to the first open side of the third member and attaching the second member to the second open side of the third member in such a way that the carrier comprises a substantially closed, hollow internal structure.

20. A method according to claim 19, comprising
forming a hollow structure in the first and the second member in such a way that the first and second member have one open side,
attaching the open side of the first member to the first open side of the third member and attaching the open side of the second member to the second open side of the third member in such a way that the carrier comprises a substantially closed, hollow internal structure.

21. A method according to claim 15 further comprising:
providing an additional plate; and
positioning the addition plate in between the first and third member or the second and third member.

22. A method according to claim 15, further comprising:
forming the hollow structure in the third member using an extrusion technique or a water jet cutting technique.

23. A method according to claim 15, further comprising:
forming openings in the carrier.

24. A method according to claim 15, wherein the at least two members forming the carrier are joined by anodic bonding.

* * * * *